(12) United States Patent
Wang et al.

(10) Patent No.: US 6,894,337 B1
(45) Date of Patent: May 17, 2005

(54) SYSTEM AND METHOD FOR FORMING STACKED FIN STRUCTURE USING METAL-INDUCED-CRYSTALLIZATION

(75) Inventors: Haihong Wang, Milpitas, CA (US); Shibly S. Ahmed, San Jose, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/768,014

(22) Filed: Feb. 2, 2004

(51) Int. Cl.[7] .............................................. H01L 27/08
(52) U.S. Cl. ......................... 257/302; 257/67; 257/618; 257/270; 438/151; 438/157; 438/283; 438/588
(58) Field of Search ........................... 257/302, 67, 618, 257/270; 438/151, 157, 283, 588

(56) References Cited

U.S. PATENT DOCUMENTS 6,312,979 B1 * 11/2001 Jang et al. .................. 438/166
6,762,483 B1 * 7/2004 Krivokapic et al. ........ 257/618

OTHER PUBLICATIONS

Digh Hisamoto et al., "FinFET–A Self–Aligned Double–Gate MOSFET Scalable to 20 nm," IEEE Transactions on Electron Devices, vol. 47, No. 12, Dec. 2000, pp. 2320–2325.

Yang–Kyu Choi et al., "Sub–20nm CMOS FinFET Technologies," 2001 IEEE, IEDM, pp. 421–424.

Xuejue Huang et al., "Sub–50 nm P–Channel FinFET," IEEE Transactions on Electron Devices, vol. 48, No. 5, May 2001, pp. 880–886.

Xuejue Huang et al., "Sub 50–nm FinFET: PMOS," 1999 IEEE, IEDM, pp. 67–70.

Yang–Kyu Choi et al., "Nanoscale CMOS Spacer FinFET for the Terabit Era," IEEE Electron Device Letters, vol. 23, No. 1, Jan. 2002, pp. 25–27.

* cited by examiner

*Primary Examiner*—Nathan J. Flynn
*Assistant Examiner*—Scott Wilson
(74) *Attorney, Agent, or Firm*—Harrity & Snyder LLP

(57) ABSTRACT

A method facilitates the formation of a stacked fin structure for a semiconductor device that includes a substrate. The method includes forming one or more oxide layers on the substrate and forming one or more amorphous silicon layers interspersed with the one or more oxide layers. The method further includes etching the one or more oxide layers and the one or more amorphous silicon layers to form a stacked fin structure and performing a metal-induced crystallization operation to convert the one or more amorphous silicon layers to one or more crystalline silicon layers.

19 Claims, 14 Drawing Sheets

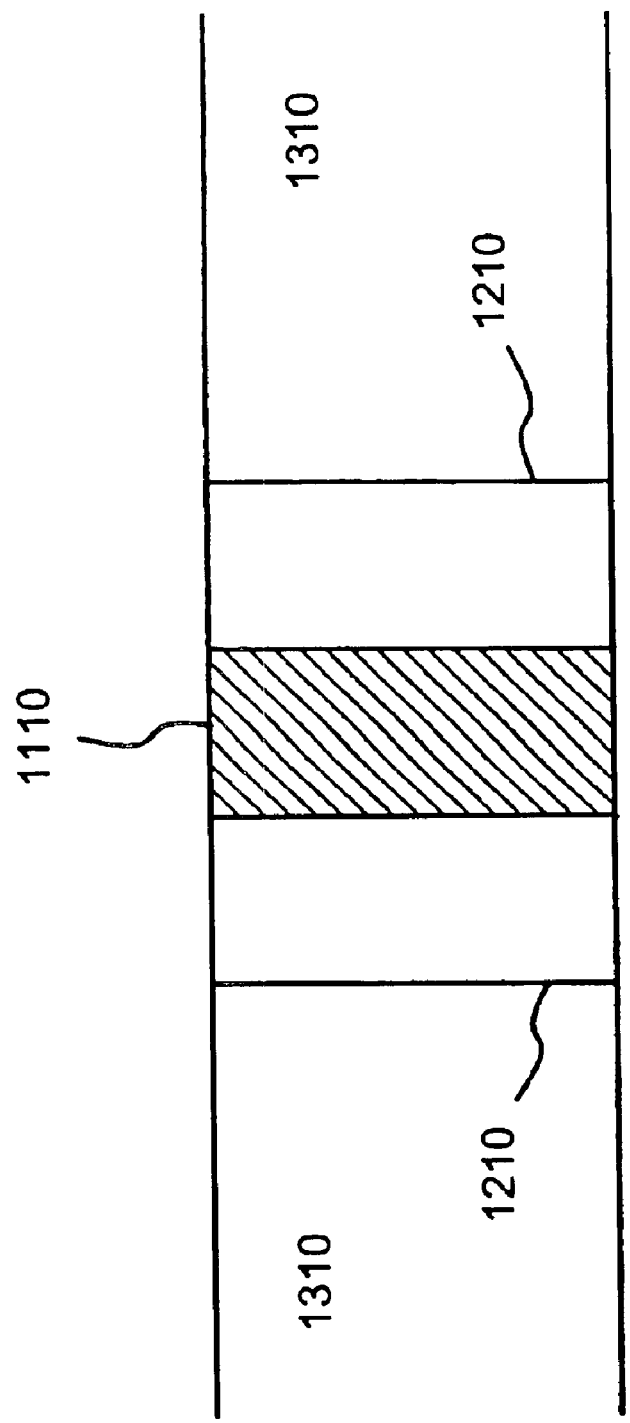

SYSTEM AND METHOD FOR FORMING STACKED FIN STRUCTURE USING METAL-INDUCED-CRYSTALLIZATION

FIELD OF THE INVENTION

The present invention relates generally to semiconductor manufacturing and, more particularly, to FinFET devices that include a stacked fin structure that is formed using metal-induced-crystallization and a method for forming the fin structures.

BACKGROUND OF THE INVENTION

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

Double-gate MOSFETs represent devices that are candidates for succeeding existing planar MOSFETs. In double-gate MOSFETs, the use of two gates to control the channel significantly suppresses short-channel effects. A FinFET is a double-gate structure that includes a channel formed in a vertical fin. Although a double-gate structure, the FinFET is similar to existing planar MOSFETs in layout and fabrication techniques. The FinFET also provides a range of channel lengths, CMOS compatibility, and large packing density compared to other double-gate structures.

SUMMARY OF THE INVENTION

Implementations consistent with the principles of the invention provide a stacked fin structure formed with the use of metal-induced-crystallization.

In accordance with the purpose of this invention as embodied and broadly described herein, a method facilitates the formation of a stacked fin structure for a semiconductor device that includes a substrate. The method includes forming one or more oxide layers on the substrate and forming one or more amorphous silicon layers interspersed with the one or more oxide layers. The method further includes etching the one or more oxide layers and the one or more amorphous silicon layers to form a stacked fin structure and performing a metal-induced crystallization operation to convert the one or more amorphous silicon layers to one or more crystalline silicon layers.

According to another aspect of the invention, a semiconductor device includes a stacked fin structure that includes one or more layers of oxide material and one or more layers of crystalline silicon material. The semiconductor device further includes a source region formed at one end of the stacked fin structure, a drain region formed at an opposite end of the stacked fin structure, and at least one gate.

According to yet another aspect of the invention, a method that facilitates formation of a stacked fin structure for a semiconductor device that includes a substrate is provided. The method includes forming a crystalline silicon layer on the substrate, forming multiple oxide layers interspersed with multiple amorphous silicon layers on the crystalline silicon layer, and etching the crystalline silicon layer, the oxide layers, and the amorphous silicon layers to form a stacked fin structure. The method further includes depositing a metal layer on side surfaces of the stacked fin structure and performing a metal-induced crystallization operation using the metal layer to convert the amorphous silicon layers to crystalline silicon layers.

BRIEF DESCRIPTION OF THE DRAWINGS

The accompanying drawings, which are incorporated in and constitute a part of this specification, illustrate an embodiment of the invention and, together with the description, explain the invention. In the drawings.

FIGS. 11–14 illustrate exemplary views for uniformly polishing a FinFET device.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention provide a stacked fin structure formed using metal-induced-crystallization. The stacked fin structure may be used for forming, for example, three dimensional devices and other applications.

Exemplary Processing

Figure 1:
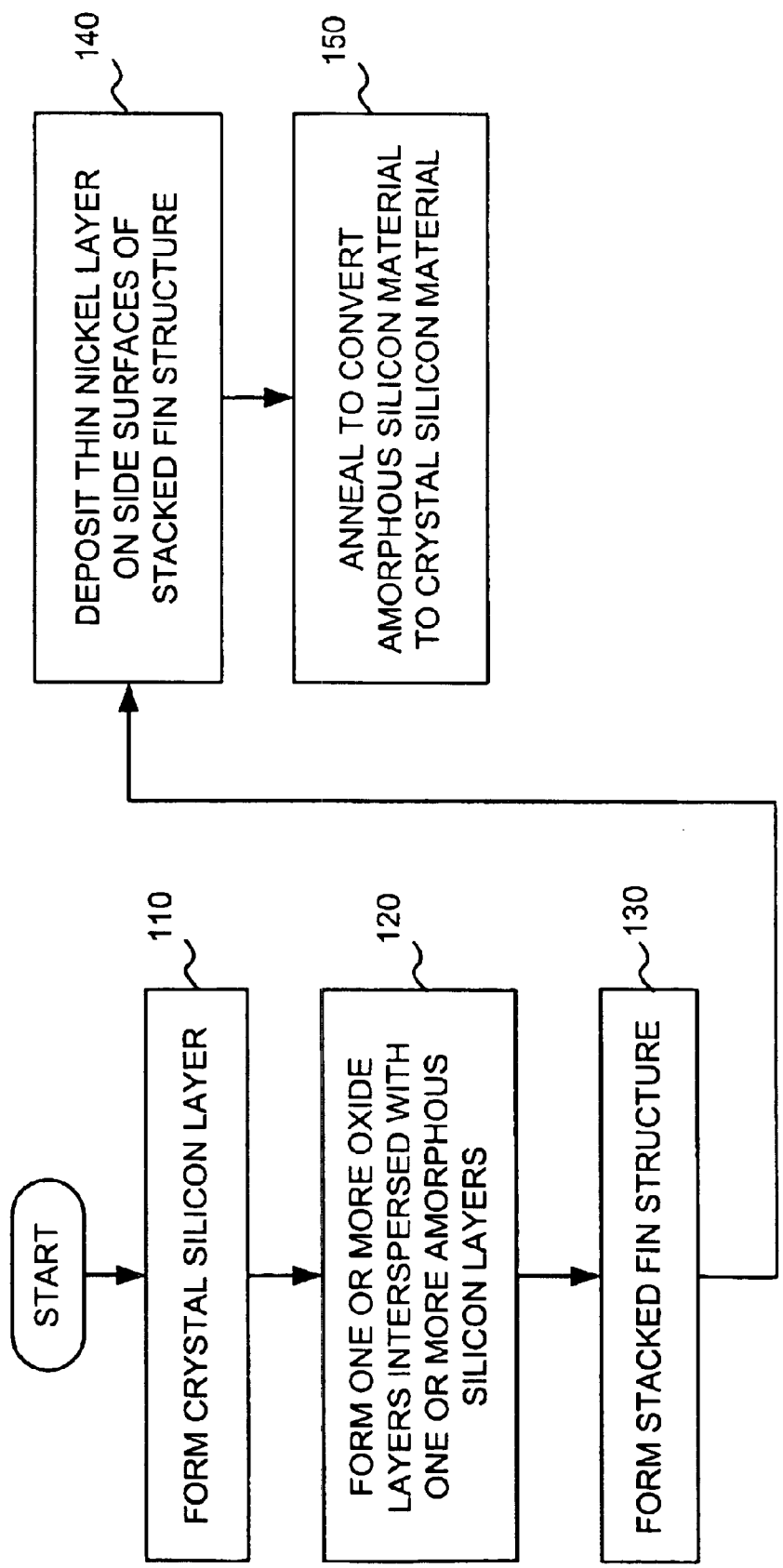
FIG. 1 illustrates an exemplary process for forming a stacked fin structure for a FinFET device in an implementation consistent with the principles of the invention.

FIG. 1 illustrates an exemplary process for forming a stacked fin structure for a FinFET device in accordance with an implementation consistent with the principles of the invention. FIGS. 2–6 illustrate exemplary views of a FinFET device fabricated according to the processing described with respect to FIG. 1. The fabrication of one FinFET device will be described hereinafter. It will be appreciated, however, that the techniques described herein are equally applicable to forming more than one FinFET device.

Figure 2:
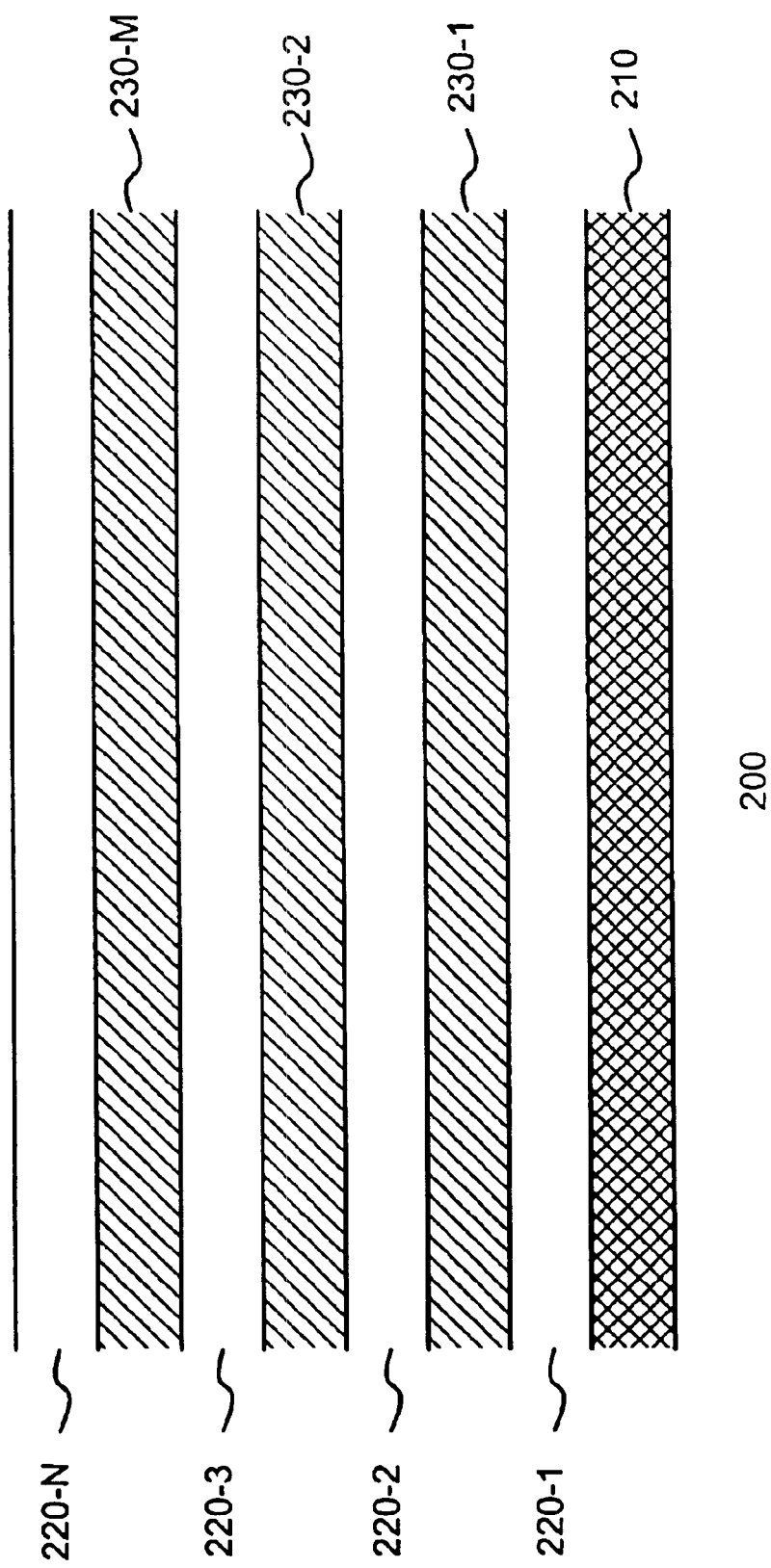
FIGS. 2–6 illustrate exemplary views of a FinFET device fabricated according to the processing described with respect to FIG. 1.

With reference to FIGS. 1 and 2, processing may begin by forming a crystalline silicon layer 210 on a substrate 200 of a semiconductor device (act 110). In one implementation, substrate 200 may include silicon. In alternative implementations consistent with the present invention, substrate 200 may include other semiconducting materials, such as germanium, or combinations of semiconducting materials, such as silicon-germanium. In another alternative, substrate 200 may include an insulator, such as an oxide layer, formed on a silicon or germanium layer.

Crystalline silicon layer 210 may be formed on substrate 200 using a conventional deposition technique to a thickness ranging from about 200 Å to about 1500 Å. In one implementation, crystalline silicon layer 210 may be formed by depositing an amorphous silicon material on substrate 200 to a thickness ranging from about 200 Å to about 1500 Å. A thin metal layer, such as nickel, may then be deposited on the amorphous silicon material. In one implementation, the nickel layer may be deposited to a thickness of about 20 Å. A metal-induced-crystallization (MIC) operation may then be performed. The MIC operation may involve annealing the nickel layer at about 500° C. to about 550° C. for several hours, which acts to diffuse the nickel into the amorphous silicon material to convert the amorphous silicon material to the crystalline silicon material of crystalline silicon layer 210.

One or more oxide layers 220 and one or more amorphous silicon layers 230 may alternately be formed on crystalline silicon layer 210 (act 120), as illustrated in FIG. 2. For example, an oxide layer 220-1 may be formed on crystalline silicon layer 210. An amorphous silicon layer 230-1 may then be formed on oxide layer 220-1. One or more additional oxide layers 220-2 through 220-N may be formed on amorphous silicon layer 230-1 interspersed with one or more additional amorphous silicon layers 230-2 through 230-M. Each of oxide layers 220 may be formed to a thickness ranging from about 100 Å to about 500 Å. Each of amorphous silicon layers 230 may be formed to a thickness ranging from about 200 Å to about 1500 Å.

Figure 3:
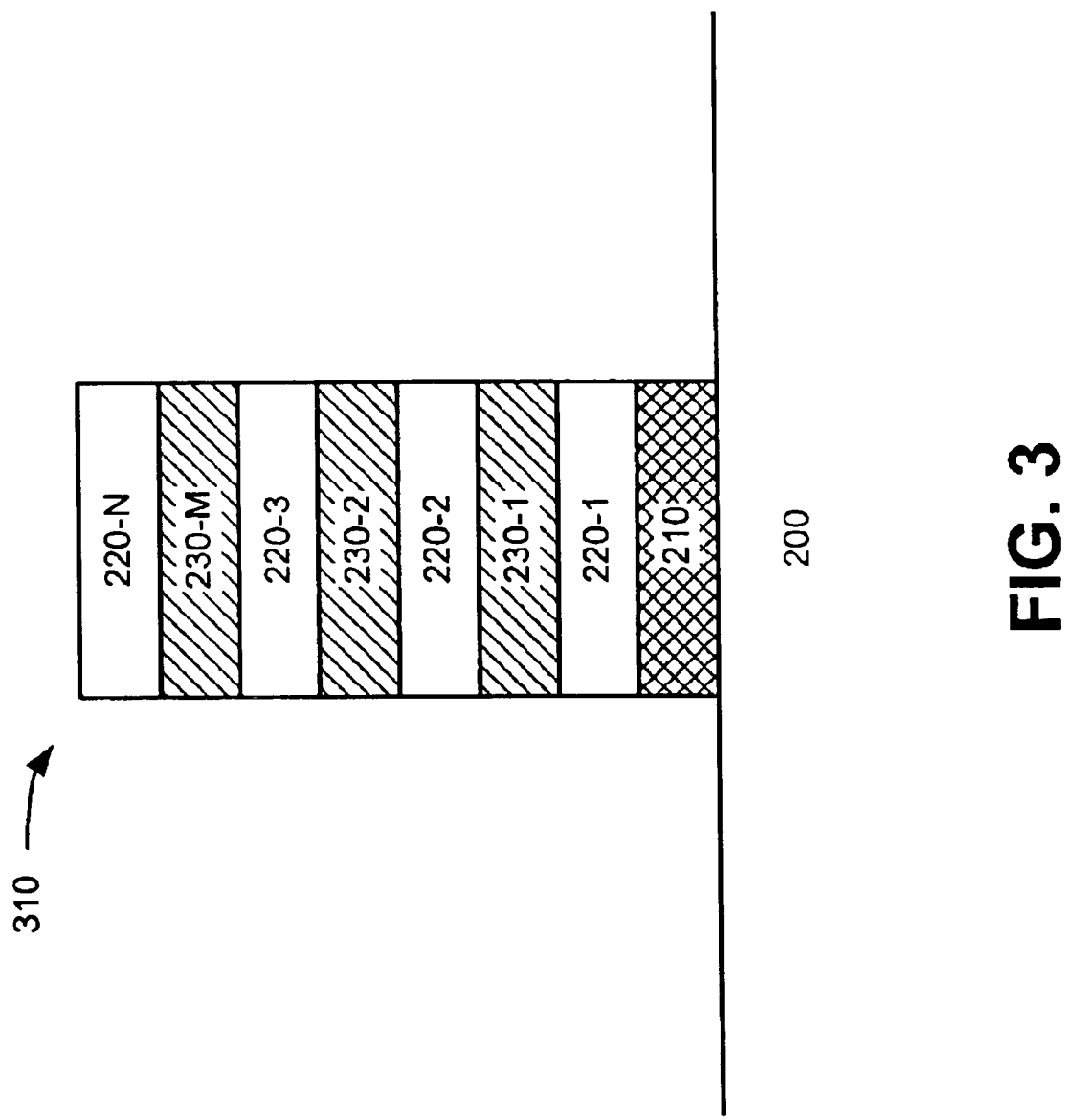

A stacked fin structure may be formed from crystalline silicon layer 210, oxide layer(s) 220, and amorphous silicon layer(s) 230 in a conventional manner (act 130), as illustrated in FIG. 3. For example, a mask may be formed over a portion of the semiconductor device and crystalline silicon layer 210, oxide layer(s) 220, and amorphous silicon layer(s) 230 may then be etched in a conventional manner, with the etching terminating on substrate 200 to form stacked fin structure 310. The resulting stacked fin structure 310 may have a width ranging from about 100 Å to about 1000 Å.

Figure 4:
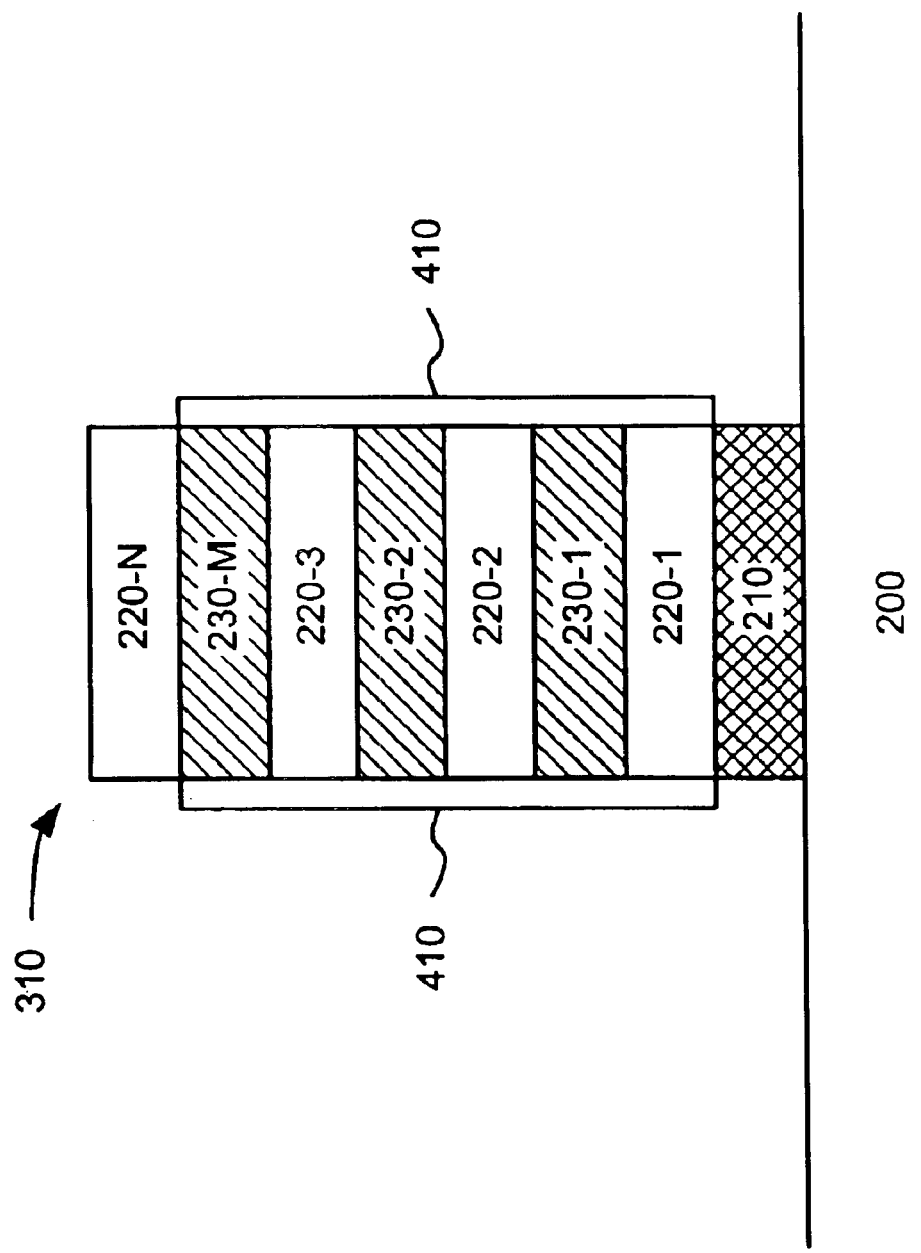

After forming stacked fin structure 310, a thin metal layer 410, such as nickel, may be deposited on side surfaces of stacked fin structure 310 (act 140), as illustrated in FIG. 4. For example, nickel layer 410 may be deposited over all or a portion of the side surfaces of stacked fin structure 310 using a conventional deposition technique. As illustrated in FIG. 4, nickel layer 410 is deposited on the side surfaces of layers 220-1 through 230-M. In another implementation, nickel layer 410 may also be deposited on the side surfaces of layer 210 and/or layer 220-N.

Figure 5:
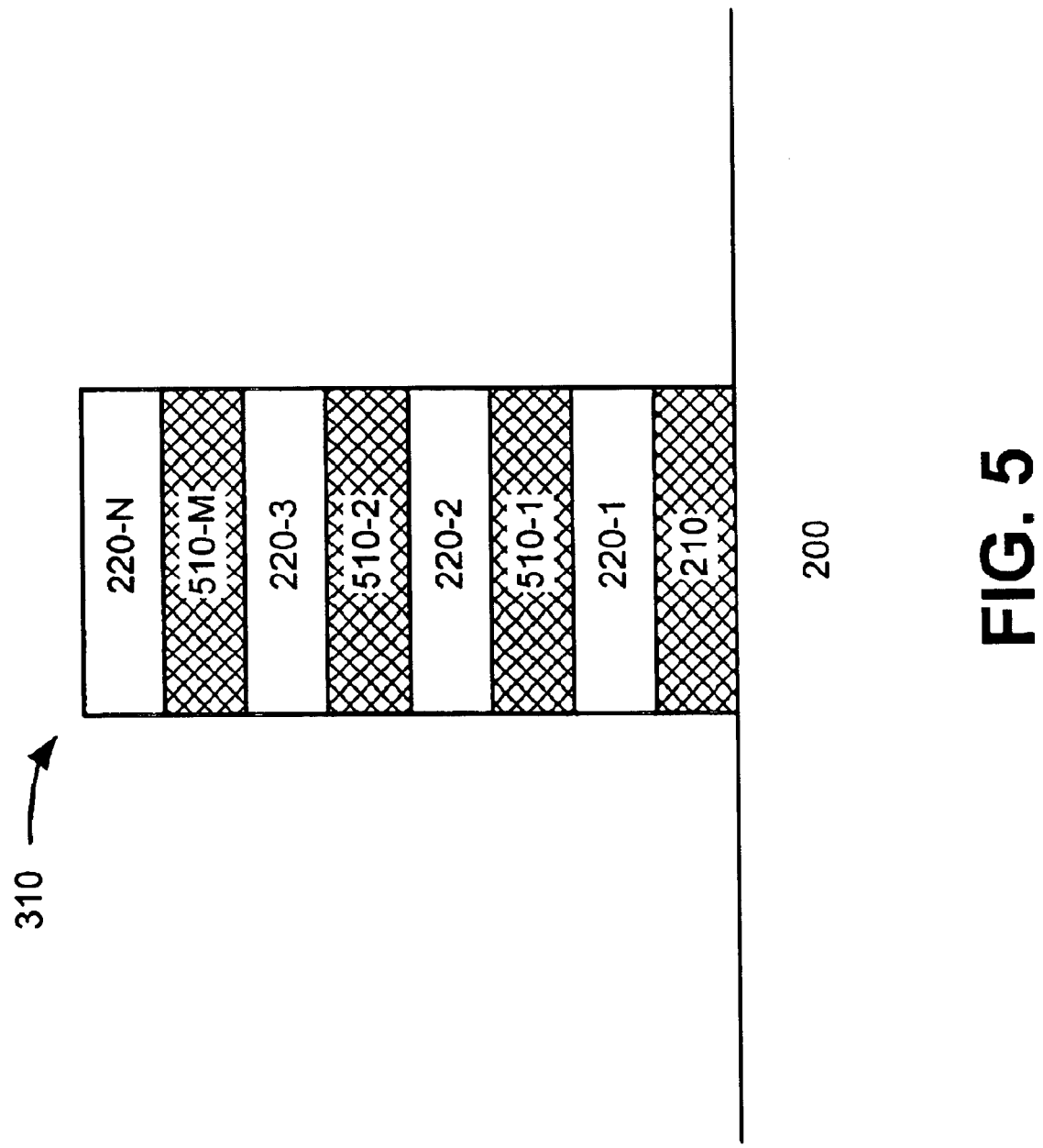

A MIC operation may then be performed. The MIC operation may involve annealing nickel layer 410 at about 500° C. to about 550° C. for several hours, which acts to diffuse the nickel into amorphous silicon layer(s) 230 to convert amorphous silicon layer(s) 230 to crystalline silicon layer(s) 510 (act 150), as illustrated in FIG. 5.

After crystalline silicon layer(s) 510 are formed, conventional FinFET fabrication processing can be performed to complete the transistor (e.g., forming the source and drain regions, contacts, interconnects and inter-level dielectrics for the FinFET device). For example, a protective dielectric layer, such as a silicon nitride or silicon oxide layer, may be formed on the top surface of stacked fin structure 310, followed by the formation of a gate dielectric on the side surfaces of stacked fin structure 310. Source/drain regions may then be formed at the respective ends of stacked fin structure 310, followed by formation of one or more gates. For example, a silicon layer, germanium layer, combinations of silicon and germanium, or various metals may be used as the gate material. The gate material may then be patterned and etched to form the gate electrodes.

Figure 6:
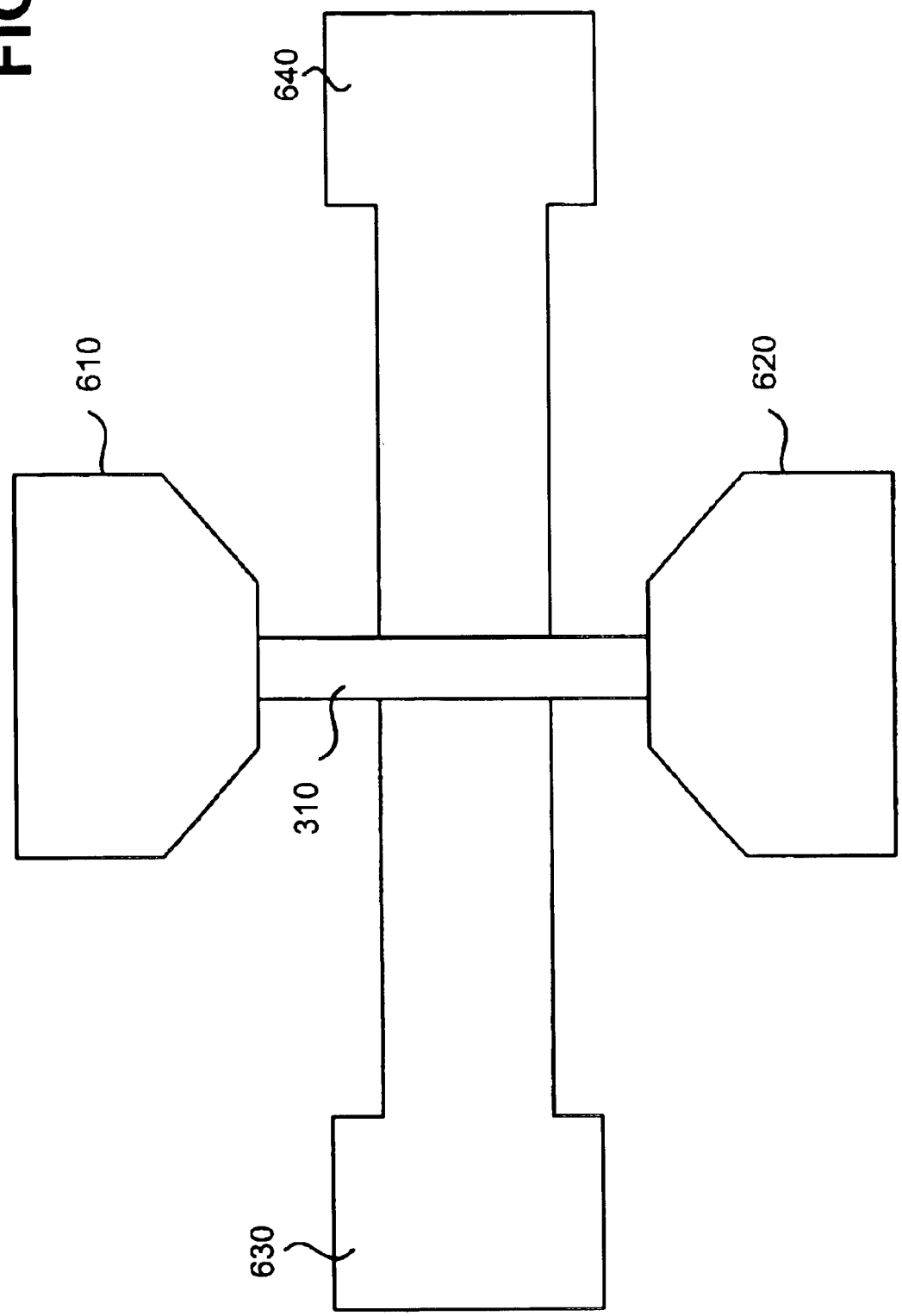

For example, FIG. 6 illustrates an exemplary top view of the semiconductor device consistent with the principles of the invention after the source/drain regions and gate electrodes are formed. As illustrated, the semiconductor device includes a double-gate structure with stacked fin structure 310, source and drain regions 610 and 620, and gate electrodes 630 and 640.

Source/drain regions 610 and 620 may be doped with n-type or p-type impurities based on the particular end device requirements. In addition, sidewall spacers may optionally be formed prior to the source/drain ion implantation to control the location of the source/drain junctions based on the particular circuit requirements. Activation annealing may then be performed to activate source/drain regions 610 and 620.

A method has been described above as forming a stacked fin structures for a FinFET device. It should be understood that methods consistent with the present invention may be used to form any number of fin structures, such as two or more fin structures, based on the particular circuit requirements.

Other Implementations

Figure 7:
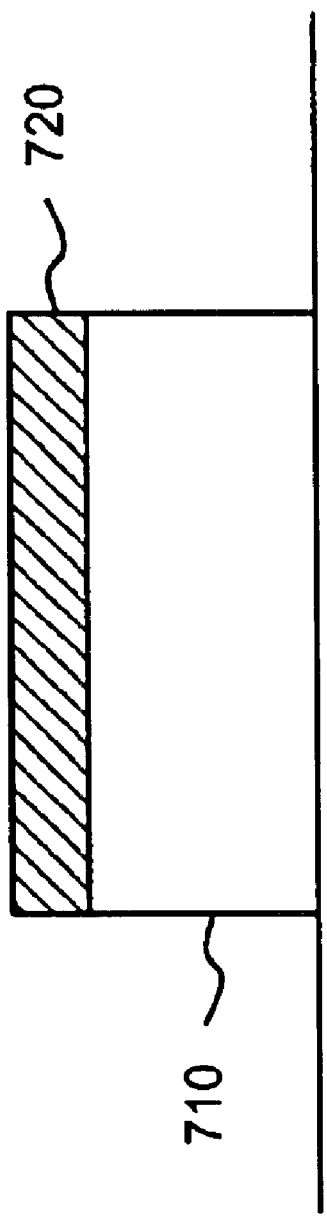
FIGS. 7–10 illustrate exemplary views of a FinFET device that includes a reversed T-shaped fin.
Figure 8:
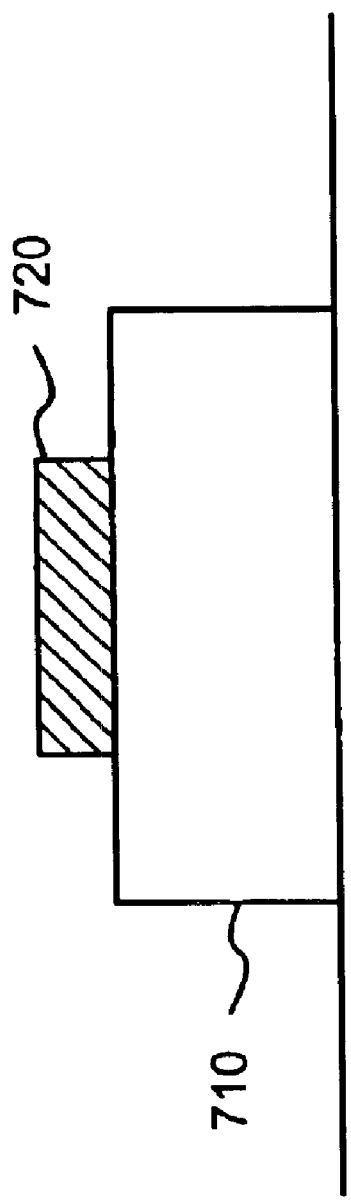
Figure 9:
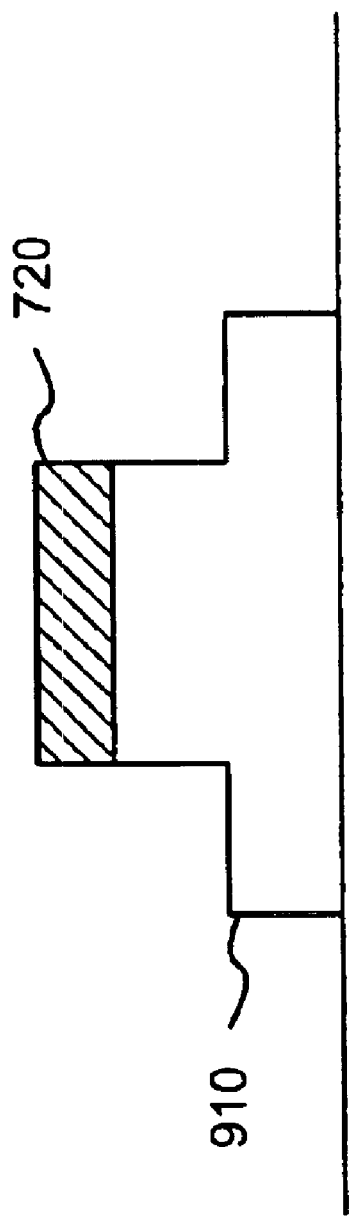
Figure 10:
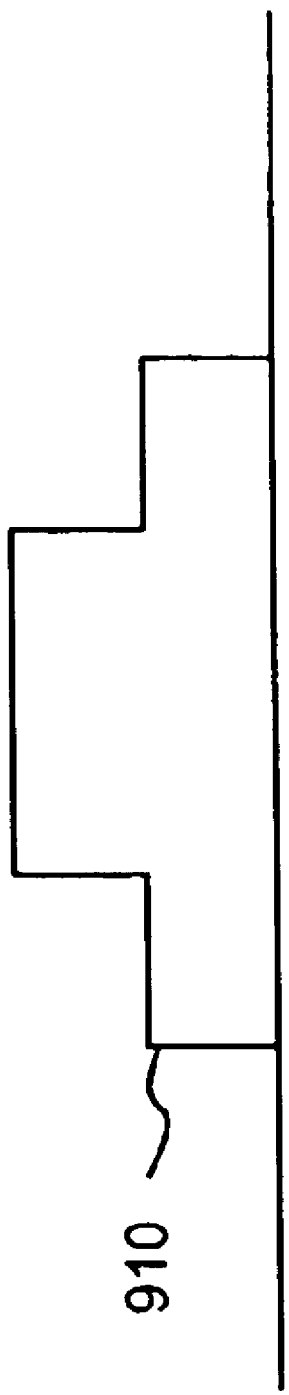

It may be desirable to form a reversed T-shaped fin for a FinFET device. FIGS. 7–10 illustrate exemplary views for fabricating a FinFET device that includes a reversed T-shaped fin. A fin 710 may be formed in a conventional manner using a hard mask 720, as illustrated in FIG. 7. The width of fin 710 may range from about 100 Å to about 1000 Å. Hard mask 720 may then be trimmed using a conventional etching technique, as illustrated in FIG. 8. For example, hard mask 720 may be trimmed to a width ranging from about 100 Å to about 1000 Å. Fin 710 may then be selectively etched using well-known etching techniques to form a reverse T-shaped fin 910, as illustrated in FIG. 9. Hard mask 720 may then be removed using well known techniques, as illustrated in FIG. 10.

Figure 11:
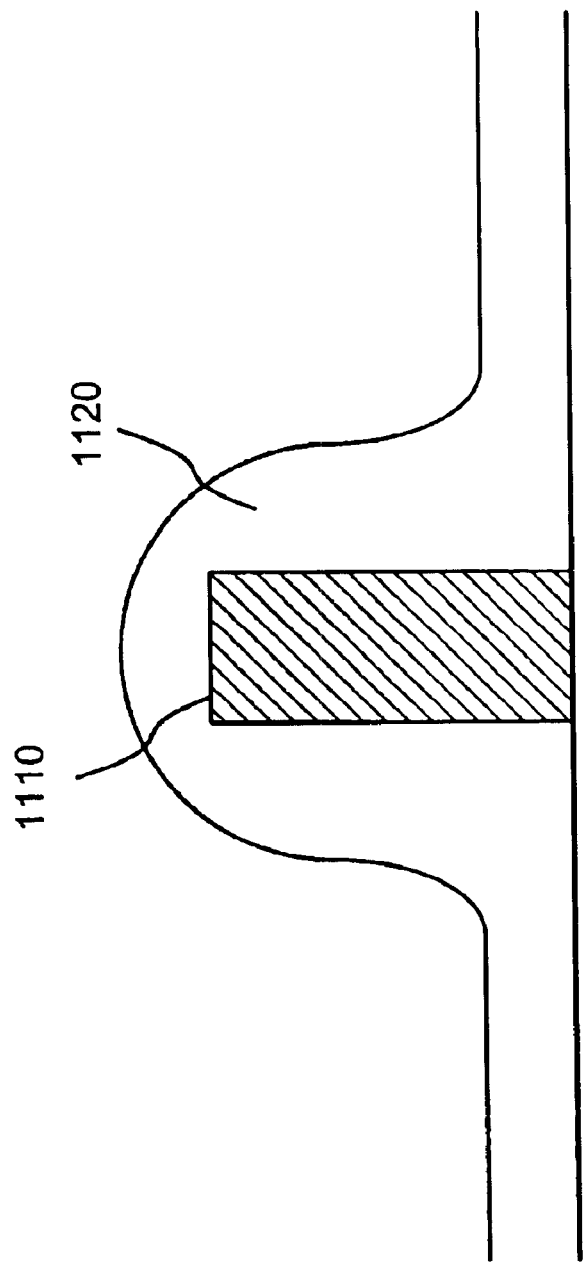

It may also be desirable to provide polish uniformity when forming a FinFET device. FIGS. 11–14 illustrate exemplary views for uniformly polishing a FinFET device. A fin 1110 may be formed on a substrate, as illustrated in FIG. 11. A polysilicon material 1120 may be formed over the substrate, covering fin 1110, as illustrated in FIG. 11. Polysilicon material 1120 may be deposited using a well known deposition technique.

Figure 12:
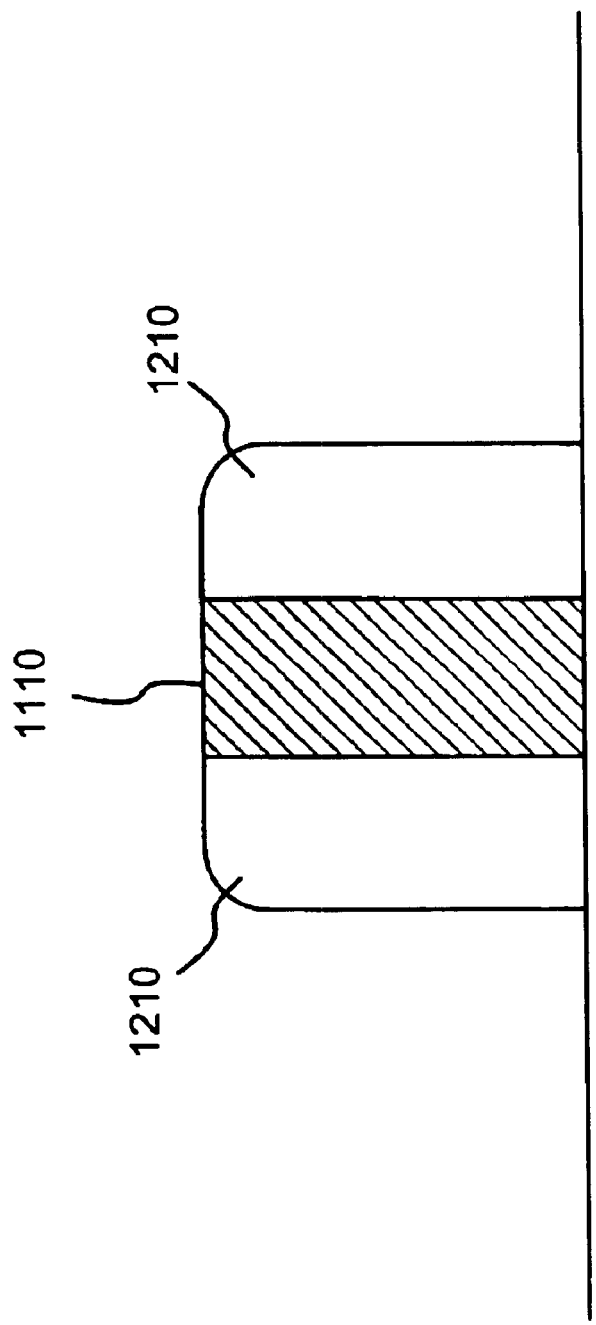
Figure 13:
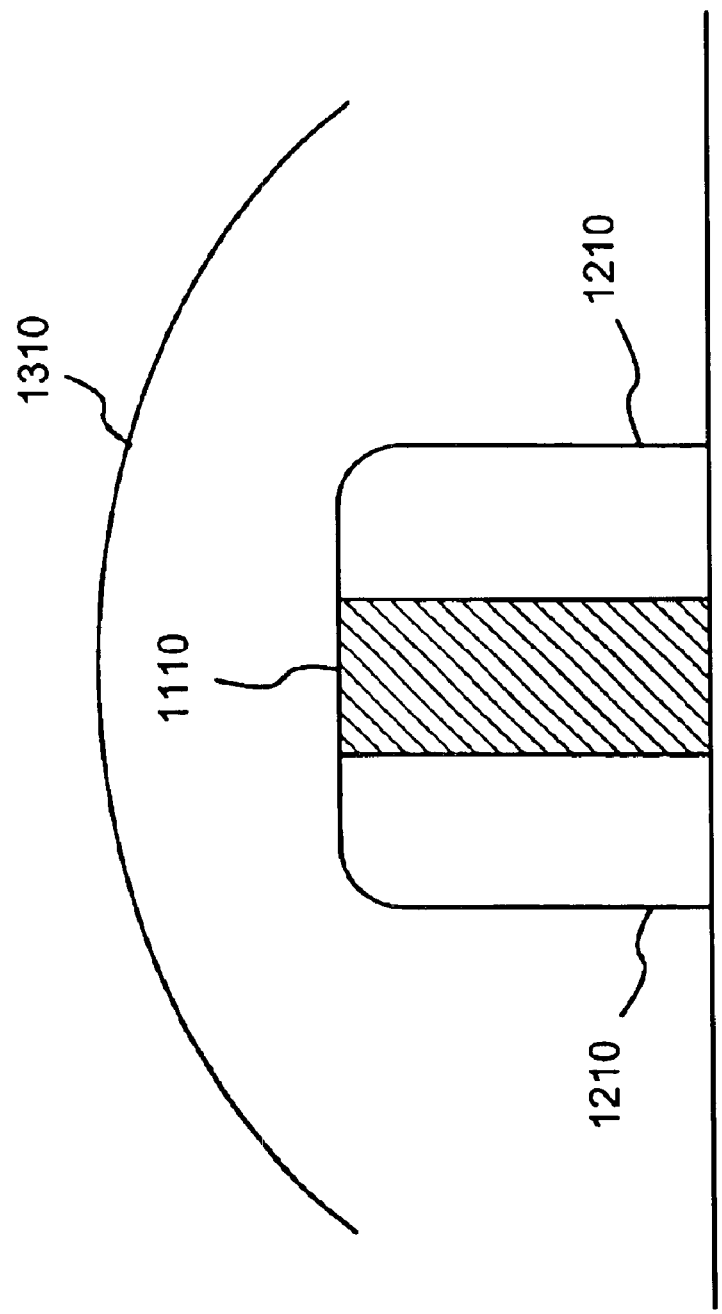

Polysilicon material 1120 may then be etched in a conventional manner, with the etching terminating at the substrate to form spacers 1210, as illustrated in FIG. 12. Polysilicon material 1310 may then be deposited using a well known deposition technique, as illustrated in FIG. 13. Polysilicon material 1310 may then be uniformly polished using, for example, chemical-mechanical polishing (CMP), as illustrated in FIG. 14, to planarize polysilicon material 1310 with the top surface of fin 1110.

CONCLUSION

Implementations consistent with the principles of the invention provide a stacked fin structure formed using metal-induced-crystallization.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention.

For example, in the above descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIG. 1, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A semiconductor device, comprising:
   a stacked fin structure including a plurality of layers of oxide material and a plurality of layers of crystalline silicon material;
   a source region formed at one end of the stacked fin structure;
   a drain region formed at an opposite end of the stacked fin structure; and
   at least one gate.

2. The semiconductor device of claim 1, wherein a width of the stacked fin structure ranges from about 100 Å to about 1000 Å.

3. The semiconductor device of claim 1, wherein a height of the stacked fin structure ranges from about 200 Å to about 1500 Å.

4. The semiconductor device of claim 1, wherein the plurality of layers of oxide material are interspersed with the plurality of layers of crystalline silicon material.

5. A method of forming a stacked fin structure for a semiconductor device that includes a substrate, the method comprising:
   forming a plurality of oxide layers on the substrate;
   forming a plurality of amorphous silicon layers interspersed with the plurality of oxide layers;
   etching the plurality of oxide layers and the plurality of amorphous silicon layers to form a stacked fin structure; and
   performing a metal-induced crystallization operation to convert the plurality of amorphous silicon layers to a plurality of crystalline silicon layers.

6. The method of claim 5, wherein a width of the stacked fin structure ranges from about 100 Å to about 1000 Å.

7. The method of claim 5, wherein a height of the stacked fin structure ranges from about 200 Å to about 1500 Å.

8. The method of claim 5, further comprising;
   forming a crystalline silicon layer on the substrate prior to forming the plurality of oxide layers.

9. The method of claim 5, wherein the forming a plurality of oxide layers includes:
   forming each of the plurality of oxide layers to a thickness ranging from about 100 Å to about 500 Å; and
   wherein the forming a plurality of amorphous silicon layers includes:
   forming each of the plurality of amorphous silicon layers to a thickness ranging from about 200 Å to about 1500 Å.

10. The method of claim 5, wherein the performing a metal-induced crystallization operation includes:
    depositing a metal layer on side surfaces of the stacked fin structure.

11. The method of claim 10, wherein the depositing a metal layer includes:
    depositing a nickel layer to a thickness of about 20 Å.

12. The method of claim 5, wherein the performing a metal-induced crystallization operation includes:
    annealing the stacked fin structure at a temperature of about 500° C. to about 550° C.

13. The method of claim 12, wherein the annealing is performed for at least two hours.

14. A method of forming a stacked fin structure for a semiconductor device that includes a substrate, the method comprising:
    forming a crystalline silicon layer on the substrate;
    forming a plurality of oxide layers interspersed with a plurality of amorphous silicon layers on the crystalline silicon layer;
    etching the crystalline silicon layer, the oxide layers, and the amorphous silicon layers to form a stacked fin structure;
    depositing a metal layer on side surfaces of the stacked fin structure; and
    performing a metal-induced crystallization operation using the metal layer to convert the amorphous silicon layers to crystalline silicon layers.

15. The method of claim 14, wherein a width of the stacked fin structure ranges from about 100 Å to about 1000 Å.

16. The method of claim 14, wherein a height of the stacked fin structure ranges from about 100 Å to about 1000 Å.

17. The method of claim 14, wherein the depositing a metal layer includes:
    depositing a nickel layer to a thickness of about 20 Å.

18. The method of claim 14, wherein the performing a metal-induced crystallization operation includes:
    annealing the stacked fin structure at a temperature of about 500° C. to about 550° C.

19. The method of claim 18, wherein the annealing is performed for at least two hours.

* * * * *